US009502857B2

(12) United States Patent
Hipwell, Jr. et al.

(10) Patent No.: US 9,502,857 B2
(45) Date of Patent: Nov. 22, 2016

(54) LASER SUBMOUNTS FORMED USING ETCHING PROCESS

(71) Applicant: Seagate Technology LLC, Cupertino, CA (US)

(72) Inventors: Roger L. Hipwell, Jr., Eden Prairie, MN (US); Dadi Setiadi, Edina, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 14/862,967

(22) Filed: Sep. 23, 2015

(65) Prior Publication Data

US 2016/0013615 A1    Jan. 14, 2016

Related U.S. Application Data

(62) Division of application No. 13/783,929, filed on Mar. 4, 2013, now Pat. No. 9,202,754.

(60) Provisional application No. 61/636,979, filed on Apr. 23, 2012.

(51) Int. Cl.
| | |
|---|---|
| *H01S 5/022* | (2006.01) |
| *H01L 21/78* | (2006.01) |
| *H01L 21/683* | (2006.01) |
| *H01S 5/02* | (2006.01) |
| *G11B 5/105* | (2006.01) |
| *G11B 5/31* | (2006.01) |
| *G11B 5/00* | (2006.01) |

(52) U.S. Cl.
CPC ........... *H01S 5/02268* (2013.01); *G11B 5/105* (2013.01); *G11B 5/3173* (2013.01); *H01L 21/6836* (2013.01); *H01L 21/78* (2013.01); *H01S 5/0201* (2013.01); *H01S 5/0226* (2013.01); *H01S 5/02236* (2013.01); *H01S 5/02272* (2013.01); *G11B 2005/0021* (2013.01); *H01S 5/02252* (2013.01)

(58) Field of Classification Search
CPC   H01L 21/6836; H01L 21/78; H01S 5/02268
See application file for complete search history.

(56) References Cited

U.S. PATENT DOCUMENTS

| | | | |
|---|---|---|---|
| 5,449,638 A | 9/1995 | Hong et al. | |
| 5,835,315 A | 11/1998 | Cohen et al. | |
| 6,214,703 B1 | 4/2001 | Chen et al. | |
| 6,607,970 B1 * | 8/2003 | Wakabayashi | .......... H01L 21/56 257/618 |

(Continued)

FOREIGN PATENT DOCUMENTS

| | | |
|---|---|---|
| JP | H04307756 | 10/1992 |
| JP | 2011096319 | 5/2011 |
| KR | 20120020944 | 3/2012 |

OTHER PUBLICATIONS

File History for U.S. Appl. No. 13/783,929 as retrieved from the U.S. Patent and Trademark Office Pair System on Sep. 23, 2015, 133 pages.

(Continued)

*Primary Examiner* — Joseph C Nicely
(74) *Attorney, Agent, or Firm* — Hollingsworth Davis, LLC

(57) ABSTRACT

A wafer is formed having a plurality of laser-to-slider submount features on a first surface. An etching process is used to form scribe lines between the submounts on the first surface of the wafer. The wafer is separated at the scribe lines to form the submounts.

15 Claims, 11 Drawing Sheets

(56) References Cited

U.S. PATENT DOCUMENTS

| | | |
|---|---|---|
| 6,635,184 B1 | 10/2003 | Cohen et al. |
| 6,642,127 B2 | 11/2003 | Kumar et al. |
| 6,838,689 B1 | 1/2005 | Deng et al. |
| 6,914,006 B2 | 7/2005 | Peiter et al. |
| 6,982,189 B2 | 1/2006 | Silverbrook |
| 7,811,903 B2 | 10/2010 | Grigg et al. |
| 8,518,748 B1 | 8/2013 | Wang et al. |
| 2001/0007367 A1 | 7/2001 | Ohkubo |
| 2005/0224920 A1 | 10/2005 | Onuma |
| 2008/0056073 A1 | 3/2008 | Shimizu |
| 2008/0316872 A1* | 12/2008 | Shimizu ............. G11B 5/314 369/13.24 |
| 2009/0246938 A1 | 10/2009 | Kim |
| 2010/0081235 A1 | 4/2010 | Furumura |
| 2011/0127646 A1 | 6/2011 | Kang et al. |
| 2011/0216635 A1 | 9/2011 | Masumoto |
| 2012/0073120 A1 | 3/2012 | Shimazawa et al. |
| 2012/0320719 A1 | 12/2012 | Arai et al. |
| 2013/0095599 A1 | 4/2013 | Abou-Kandil et al. |
| 2013/0277806 A1 | 10/2013 | Hipwell et al. |
| 2014/0057411 A1 | 2/2014 | Hoang et al. |

OTHER PUBLICATIONS

International Search Report and Written Opinion dated Sep. 26, 2013 from PCT Application No. PCT/US2013/037814, 9 pages.

* cited by examiner

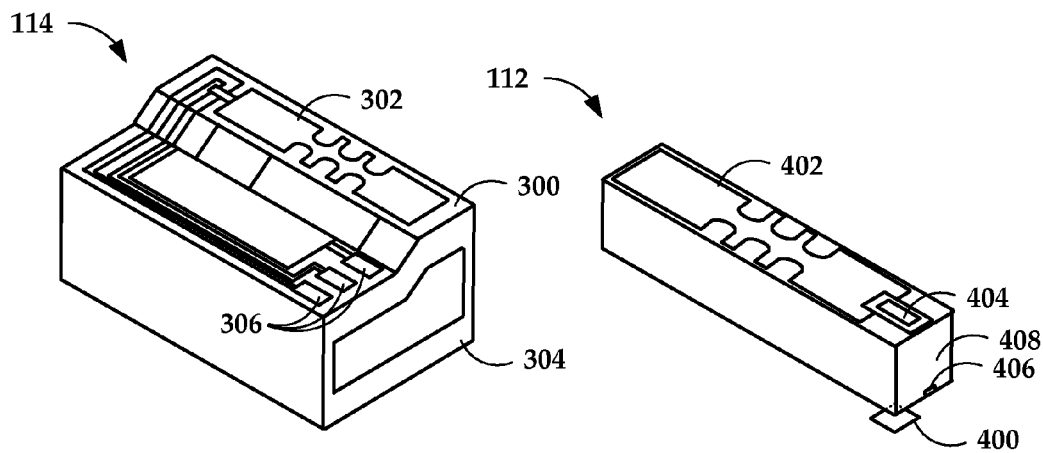
FIG. 3
FIG. 4
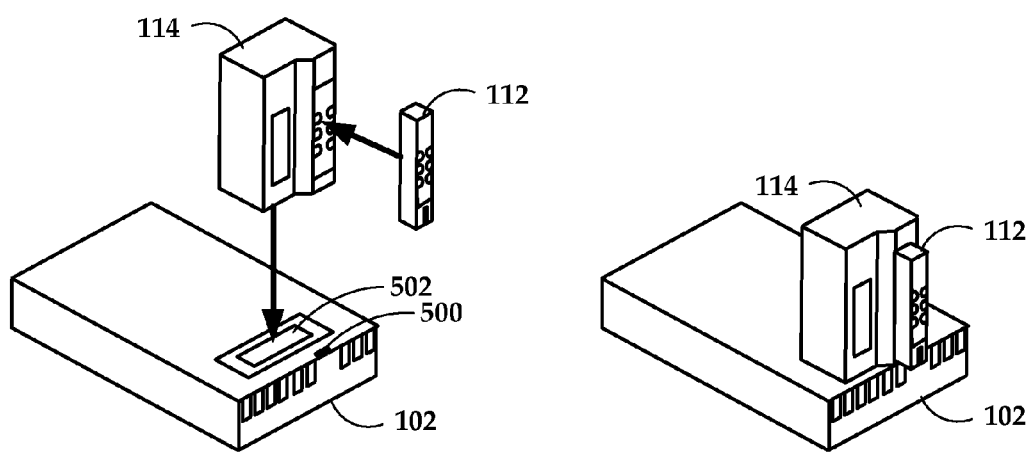
FIG. 5
FIG. 6

LASER SUBMOUNTS FORMED USING ETCHING PROCESS

RELATED PATENT DOCUMENTS

This application is a divisional of U.S. Ser. No. 13/783,929, filed Mar. 4, 2013, which claims the benefit of Provisional Patent Application Ser. No. 61/636,979 filed on Apr. 23, 2012, to which priority is claimed and which are hereby incorporated herein by reference in their entireties.

SUMMARY

One embodiment described herein is generally directed to a method involving forming a wafer having a plurality of laser-to-slider submount features. An etching process is used to form scribe lines at a first surface of the wafer. The scribe lines define submount edges and provide control of an alignment dimension between the submount edges and the laser-to-slider submount features. Material is removed from a second surface of the wafer that is opposed to the first surface. The removing of the material from the second surface separates submounts at the scribe lines and defines a thickness of the submounts.

In another embodiment, a wafer is formed having a plurality of laser-to-slider submount features. The wafer includes a first surface and a temporary layer opposite the first surface. An etching process is used to form scribe lines between the laser-to-slider submount features on the first surface of the wafer. The scribe lines extend to the temporary layer and define an alignment dimension between the laser-to-slider submount features and submount edges. The wafer is separated from the temporary layer to form submounts. The separating of the wafer from the temporary layer separates submounts at the scribe lines.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

FIG. 3 is a perspective view of a laser submount according to an example embodiment;

FIG. 4 is a perspective view of a laser according to an example embodiment;

FIGS. 5-6 are perspective views illustrating assembly of laser submount and laser shown in FIGS. 3-4 to a slider body according to an example embodiment;

DETAILED DESCRIPTION

The present disclosure relates to assembly of miniature optical and mechanical components, such as are used heat assisted magnetic recording (HAMR), also referred to as thermally assisted magnetic recording (TAMR). Generally, a HAMR read-write head includes electromagnetic components similar to a conventional magnetic hard drive read-write head (often referred to as a "slider"), such as a write coil and read head sensor. A HAMR read write head also includes a source of energy (e.g., laser) used for heating a small spot on a magnetic media (e.g., disk). The laser energy is used to excite a near-field transducer near the magnetic writer to create a precisely focused thermal spot on the magnetic media. A HAMR device uses a magnetic storage media with higher coercivity than conventional magnetic media, and the hotspot temporarily lowers the coercivity so that data can be written to the heated area. This generally allows for higher areal density to be achieved than with current magnetic recording technologies.

Figure 1:
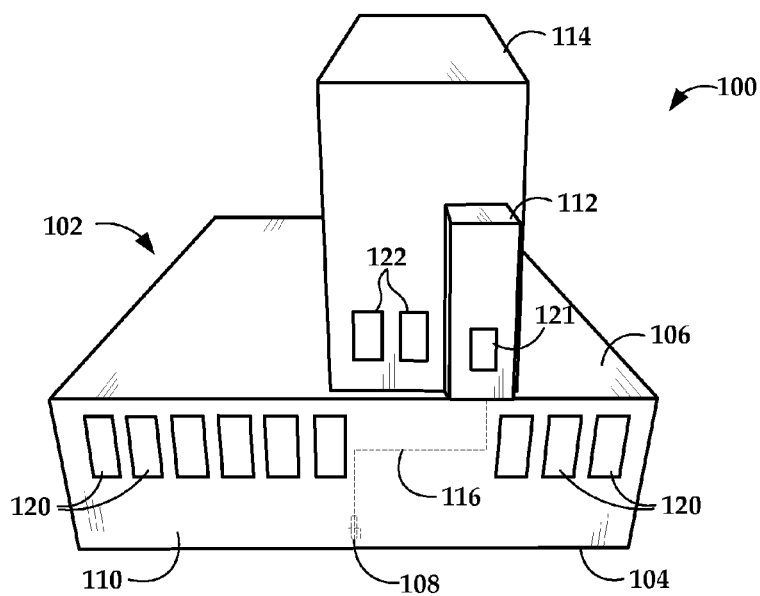
FIG. 1 is a perspective view of a slider according to an example embodiment.

In a number of existing HAMR designs, a laser is manufactured separately from the slider that houses the read/write head. The laser can be physically attached to the slider, or attached elsewhere and optically coupled to the slider (e.g., via an optic fiber). The present disclosure relates to one example of the former arrangement, referred to herein as laser-on-slider (LOS). In FIG. 1, a perspective view shows a LOS assembly 100 according to an example embodiment.

The slider assembly 100 includes a body portion 102 having a media-facing surface 104 and a top surface 106. The media-facing surface 104 faces a magnetic media surface (e.g., disk surface, not shown) during operation. A read/write head region 108 is located at the media-facing surface 104 near a trailing edge 110 of the slider body. The read/write head region 108 includes respective one or more read transducers and write transducers, as well as an optical component (e.g., a near-field transducer) that directs a small beam of energy onto the media surface. The energy is provided by a laser 112 attached to a submount 114, both of which are attached to the top surface 106 of the slider body 102.

The laser 112 directs light to an optical interface (not shown) of the slider body 102, where it is coupled to a waveguide 116 that directs light to the read/write head region 108. The laser 112 in this example is an edge-emitting laser diode, and may be coupled to the waveguide 116 via a facet, grating, lens or other coupling structure known in the art. Generally, the slider body 102 is an integrated optics device that is formed together with the waveguide 116 and read/write head region 108.

The field of integrated optics relates to the construction of optics devices on substrates, sometimes in combination with electronic components, to produce functional systems or subsystems. The processes used are similar to those used in semiconductor fabrication, e.g., layer deposition, photomasking, etching, etc. For example, a component such as the waveguide 116 may be formed as a layer of materials with appropriate relative refractive indices so that light propagates through the waveguide in a manner similar to an optic fiber.

The laser 112 and submount 114 may also be formed using integrated optics and/or integrated circuit manufacturing processes. However, in this example, the laser 112 and submount 114 are not formed together with the slider body 102 in the same layer deposition process. The laser 112 and submount 114 are formed separately and later attached together (e.g., using pick and place then solder reflow bonding) with the slider body 102 to form the slider assembly 100. The slider body 102, laser 112 and submount 114 have electrical connecting pads 120-122 that attach with other structures that are part of what is referred to as a head-gimbal assembly.

Figure 2:
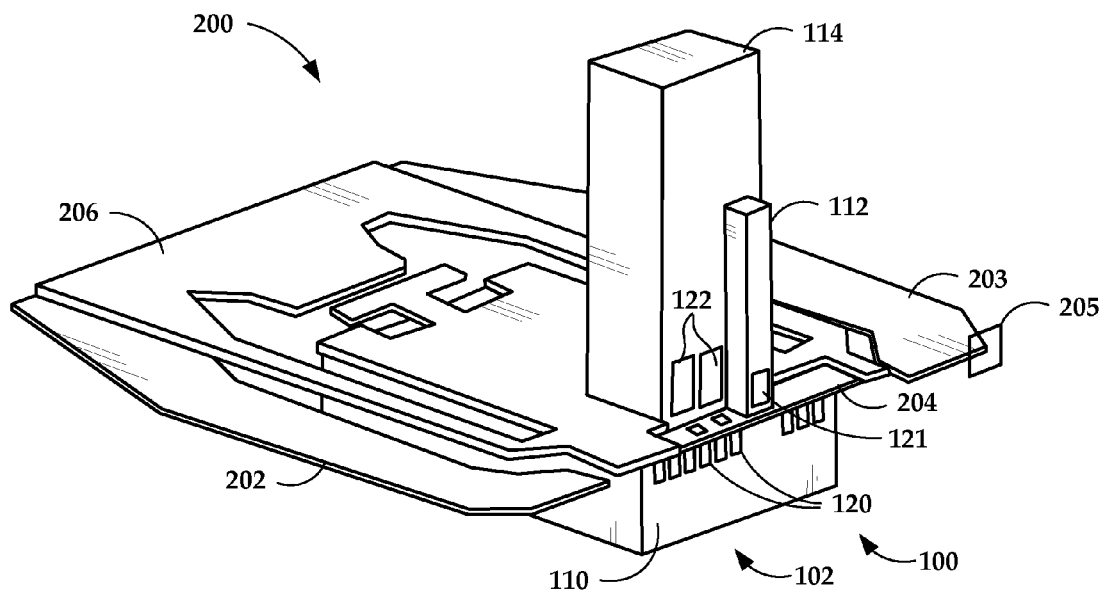
FIG. 2 is a perspective view of a head-gimbal assembly according to an example embodiment.

In FIG. 2, a perspective view shows a head-gimbal assembly 200 that includes the slider assembly 100 of FIG. 1. The head gimbal assembly 200 includes flex circuit portions 202, 203 that electrically interface with the slider assembly 100 via an interface board 204. Portions of the flex circuit portions 202, 203 that join with interface board 204 are cut away along plane 205 in this illustration to make it easier to view the trailing edge 110 of the slider body 102. The interface board 204 has traces on upper and lower surfaces that are coupled (e.g., soldered) to the pads 120-122 of the slider body 102, laser 112 and submount 114. The head-gimbal assembly 200 also includes a suspension 206 that mechanically couples with the slider assembly 100. The head-gimbal assembly 200 is held over a media surface (e.g., spinning disk) to read and write data from/to the media.

The submount 114 provides mechanical and electrical connections between the laser 112, slider body 102, interface board 204 and suspension. The submount 114 can affect alignment between these and other components, which can be important in some cases. For example, precise alignment between the laser 112 and slider body 102 will help minimize losses at the interface therebetween due to poor optical coupling into the slider integrated optics. As a result, it is desired to maintain tight dimension control of the submount 114, which will help in maintaining precise alignment of the laser emission edge to the bonding edge of the submount 114.

Current methods for submount dicing (such as saw or scribe and cleave) do not leave a smooth, well-aligned edge on the submount 114. Submounts produced in such a way may require active adjustment/alignment during or post assembly, which may result in slow or costly laser-to-submount assembly and/or low yields. This disclosure relates to an anisotropic etch process, such as reactive ion etching (RIE), to precisely create one or more bonding surfaces on a laser-on-slider submount. The precision of the position and wall angle for this etch create an opportunity of a more cost-effective manufacturing process for laser-to-submount attach and potentially for laser/submount to slider attachment. This may allow assemblies to be mass produced using passive self-alignment during solder reflow and/or with the aid of mechanical stops. It will be understood that, while the manufacturing processes for producing precision surface are described below as producing laser submounts, the processes may also be used to produce other devices requiring precise edge dimensions, such as sliders and lasers.

In order to further understand the manufacturing processes, FIGS. 3-6 show details regarding the assembly of components that form a slider assembly 100 according to an example embodiment. In FIG. 3, a perspective view illustrates details of the submount 114, and FIG. 4 illustrates details of a laser 112 that is configured to be coupled to the submount 114. The submount 114 includes a laser mounting surface 300 that interfaces with a mounting surface 400 of the laser 112 (the mounting surface 400 is hidden in this view). The mounting surface 300 of the submount 114 may include thermal and/or conductive bonding pads 302. The submount geometry may have multiple heights, as shown in FIG. 3, or be planar, as shown in FIG. 2. These are and other features may be varied to meet component design, assembly, and manufacturing constraints. A lower surface 304 of the submount 114 interfaces with a region of the slider body 102 (see region 502 in FIG. 5).

The submount 114 includes electrical bonding pads 306 that are conductively coupled to traces of the head-gimbal assembly. As seen in FIG. 4, the laser 112 also includes a bonding pad 404 that is coupled to traces of the head-gimbal assembly and an output facet 406 that delivers light from a lower surface 408 into the slider. Region 402 (as well as patterned regions on surface 302 of the submount 114) may serve as a heat sink as well as a conductive trace.

In FIG. 5, an exploded view shows the slider body 102, laser 112, and submount 114 before assembly. These components are shown in FIG. 6 after assembly. Of interest in the final assembly is the alignment between the output facet 406 (see FIG. 4) of the laser with a waveguide coupler 500 of the slider body 102. In the following examples, manufacturing processes are described that provide precise alignment between the lower laser surface 408 and lower surface 304 of the submount, which assists in proper spacing and alignment of the output facet 406 to the waveguide coupler 500.

Figure 7:
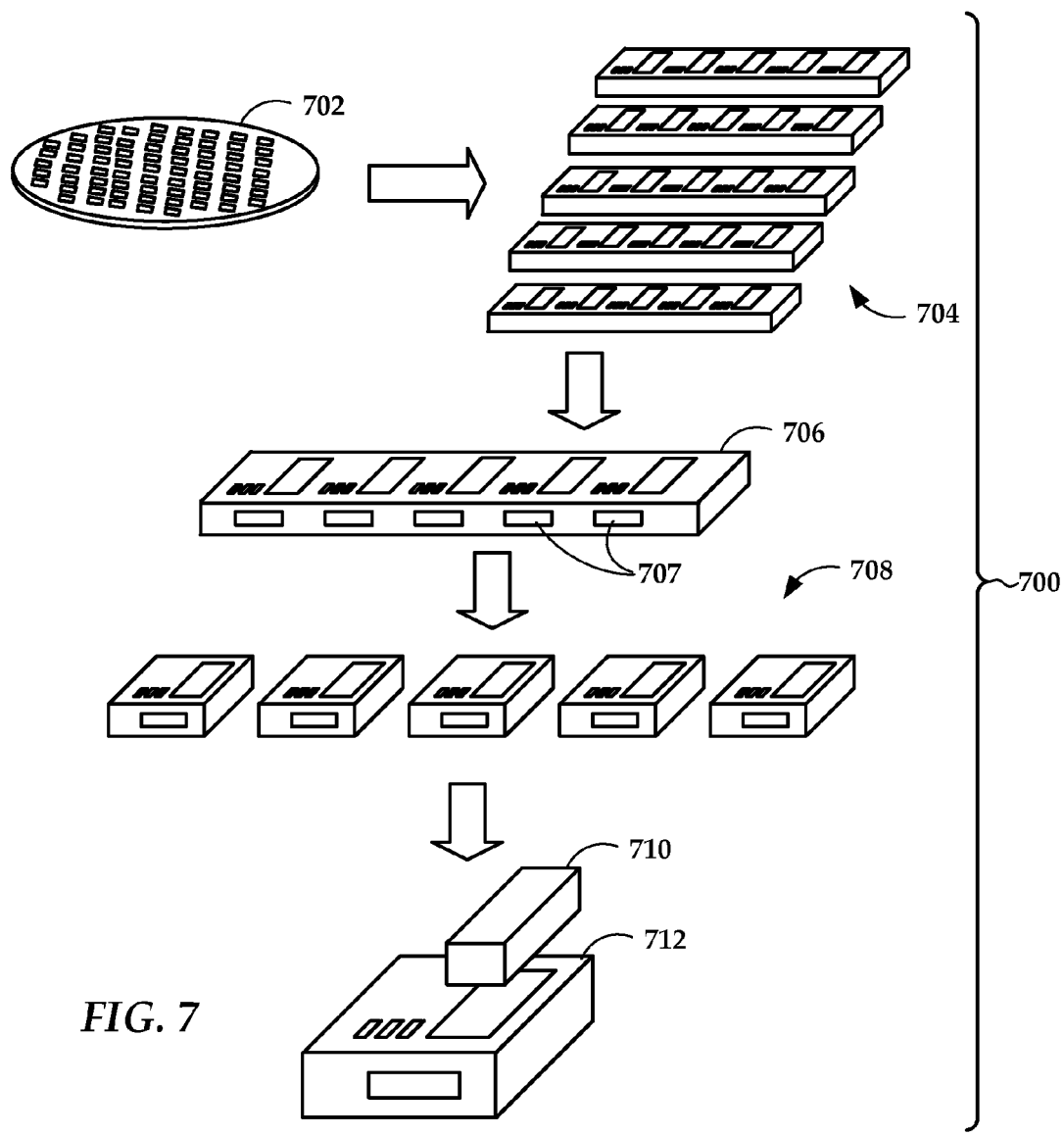
FIG. 7 is a diagram illustrating a manufacturing process for a laser and submount according to an example embodiment.

In reference now to FIG. 7, a block diagram illustrates a high level process 700 for manufacturing submounts according to an example embodiment. The individual submounts are formed on a silicon wafer 702 using lithography processes. The wafer 702 is divided into bars 704, with example individual bar 706 shown in greater details. While the illustrated figure shows a disc shaped wafer 702, the term "wafer" may include any shape (e.g., portions of the wafer 702) and size of material that has at least two bars 704 that are separated as described herein. Bar 706 may optionally have side bonding pads 707 patterned after being sliced into bars. Each individual bar 704, 706 is further divided into submounts 708. A laser 710 is mounted to a submount 712, either before or after the submount 712 is attached to a slider body (not shown).

Figure 8:
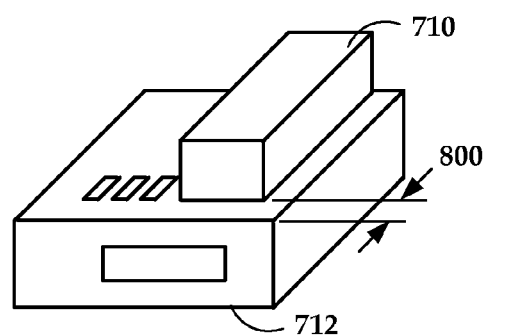
FIG. 8 is a perspective view of a laser and submount assembly according to an example embodiment.

As mentioned above, various techniques are described herein that facilitate precisely defining an alignment dimension 800 between submount 712 and laser 710 as shown in FIG. 8. A first aspect of these techniques involves precisely dividing the wafer 702 into bars 704 to precisely define an edge so that patterned features (such as laser bonding metals and fiducials) can be used to precisely align a laser on the top surface of the submount. Processes related to this aspect could also be potentially applied towards dividing the bars 704 into submounts 708.

Figure 9:
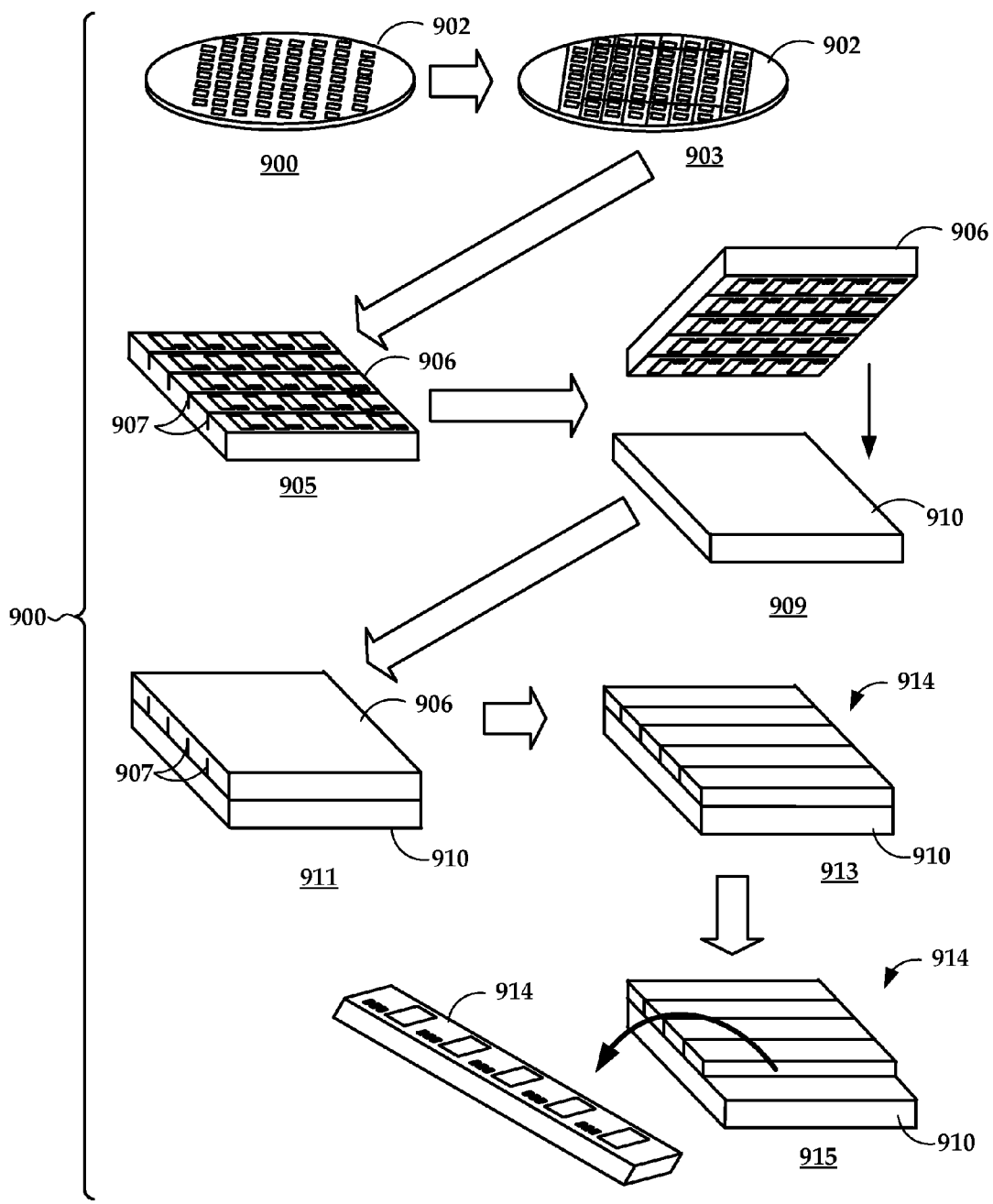
FIGS. 9 and 10 are diagrams illustrating manufacturing processes for a laser submount according to example embodiments.

In reference now to FIG. 9, a block diagram illustrates a process 900 used to divide a wafer 902 into bars 914 according to a first example embodiment. This process 900 may also be used to form individual submounts, either from bars 914 or directly from the wafer 902. The process 900 utilizes photolithography and RIE or deep reactive ion etch (DRIE) to define the bar edge on a silicon substrate. A silicon wafer 902 is formed at processing step 903 using photolithography processes as known in the art. The wafer 902 includes submount pads (e.g., laser bonding pads) and photodiode on a first surface. The first surface of the wafer 902 is etched to define individual bars at process step 903. This process step 903 may involve RIE, DRIE, wet etch, and other variations described below. A portion 906 of the etched wafer 902 is seen at process step 905. As seen by scribe lines 907, the RIE does not go through the entire wafer portion 906. The scribe lines 907 may be 200 um to 400 um deep in some HAMR applications.

At process step 909, the previously prepared wafer portion 906 is attached (e.g., bonded) etched-side down to a temporary handling substrate or film 910. The result of this is seen at processing step 911, where the un-etched, second surface of the wafer portion 906 is shown facing upwards. The un-etched second surface can be subjected to a process that removes material from the second surface (e.g., backgrind or polish to thin the wafer portion 906 to a desired thickness, e.g., until the scribe lines 907 have been reached as seen at processing step 913. At processing step 915, the individual bars 914 can be removed from the temporary substrate or film 910. This processing step 915 may be accomplished using application of ultraviolet (UV) or thermal energy, and/or by using a chemical release. The bars 914 can be further processed as described herein.

Figure 10:
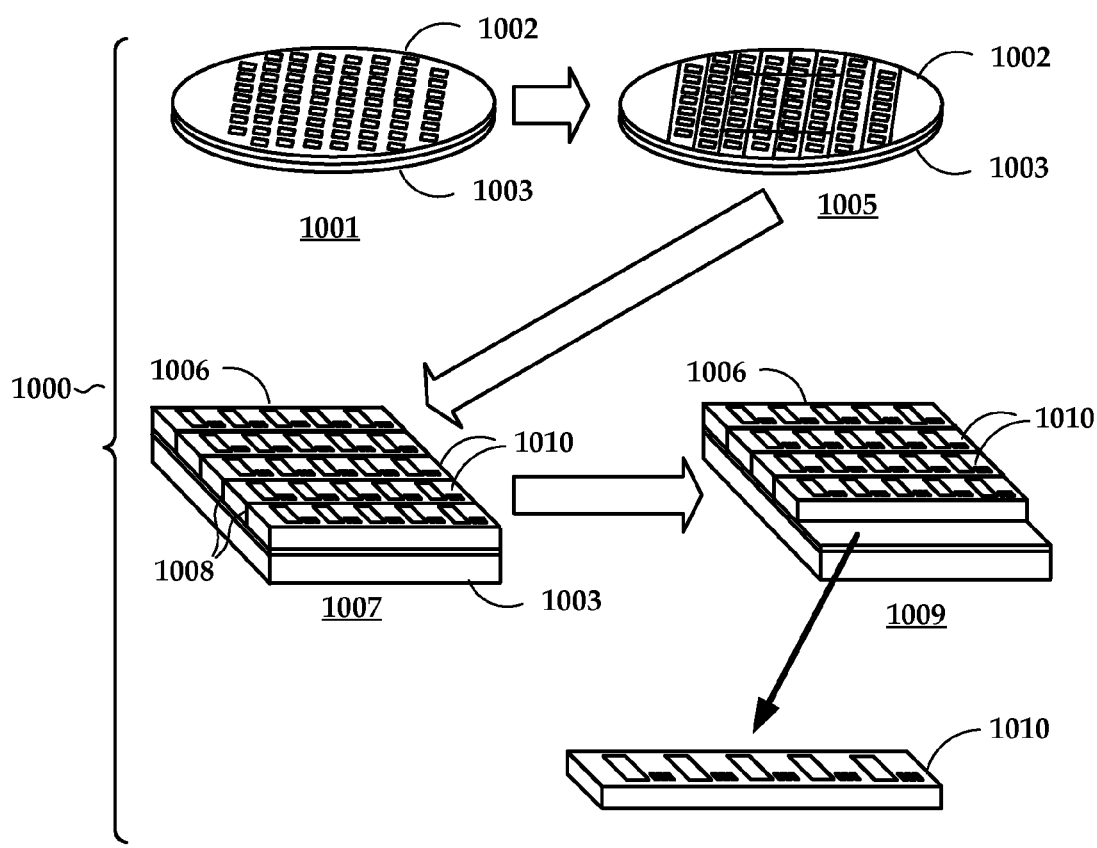

In reference now to FIG. 10, a block diagram illustrates a process 1000 used to divide a wafer 1002 into bars 1010 according to another example embodiment. This process 1000 may also be used to form individual submounts, either from bars 1010 or directly from the wafer 1002. A silicon wafer 1002 is formed at processing step 1001 using photolithography processes as known in the art. The wafer 1002 includes submount pads (e.g., laser bonding pads) and photodiodes formed on a first surface. A temporary substrate or film 1003 is located opposite the first surface. The thickness of the wafer 1002 is the desired thickness of the submounts, and the wafer 1002 is mounted to the temporary substrate or film 1003 before it is etched. At process step 1005, the wafer 1002 is etched to define individual bars. This process step 1005 may involve RIE, DRIE, wet etch, and other variations described below.

A portion 1006 of the etched wafer 1002 and handling substrate/film 1003 is seen at process step 1007. As seen by scribe lines 1008, the DRIE has caused the scribe lines to extend to the temporary substrate or film 1003, e.g., proximate a surface of or penetrating into the temporary substrate or film 1003. The scribe lines 1008 may be 200 um to 400 um deep. Because the scribe lines 1008 stop precisely at the temporary substrate or film 1003, the etched wafer portion can be separated into separate bars 1010 by removal 1009 from the temporary substrate or film 1003. The removal 1009 may be performed using UV, thermal, and/or chemical release, as shown at process step 1009.

A second aspect related to producing LOS assemblies involves the alignment between laser and submount. In reference now to FIG. 11, a block diagram illustrates a process 1100 of assembling a laser 1102 to submount 1104 according to an example embodiment. A mounting edge 1106 of the submount 1104 is precisely defined relative to laser bonding pads 1108 as indicated by alignment dimension 1110. The laser bonding pads 1108 are supposed to line up with pads 1112 on the underside of the laser 1102 to ensure proper alignment of the laser 1102 to the slider body. However, processes used to place the laser 1102 on the submount 1104 (e.g., rapid "tack bonding" of lasers using a pick and place machine) may not have the required positional accuracy.

Figure 12:
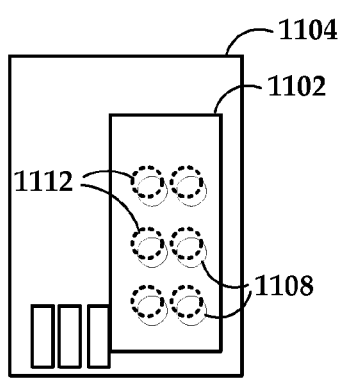
FIGS. 12 and 13 are top views illustrating alignment between laser submount and laser according to an example embodiment.
Figure 13:
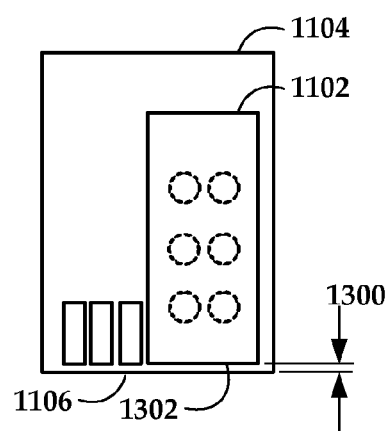

In this example, the laser 1102 and submount 1104 are aligned through passive alignment or self-alignment. As seen in the top view of FIG. 12, the laser 1102 and submount 1104 are misaligned due to inaccuracies of the placement process. The pads 1108 and/or 1112 include a bonding material (e.g., solder bumps) that will melt during reflow of the parts 1102, 1104. The reflow may involve a batch reflow at bar level or die level in an active environment (e.g., formic acid in a heated vacuum chamber) to remove surface oxides. The surface tension of the bonding material during reflow causes the parts 1102, 1104 to align to each other, as seen in the top view of FIG. 13. After alignment, an alignment dimension 1300 between the laser edge/facet 1302 and an edge 1106 of the submount is within a desired tolerance.

Figure 11:
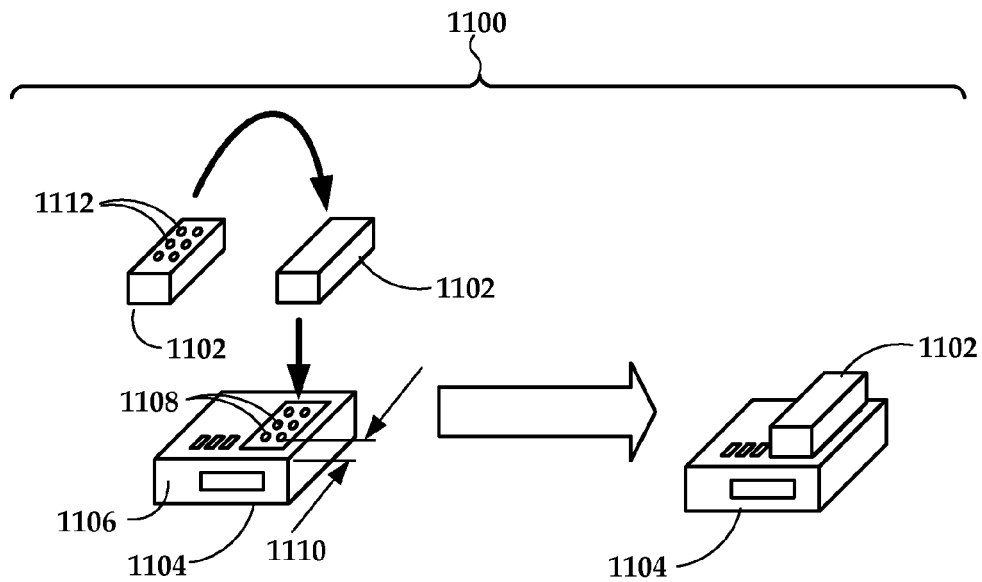
FIG. 11 is a perspective view illustrating assembly of laser submount and laser according to an example embodiment.
Figure 14:
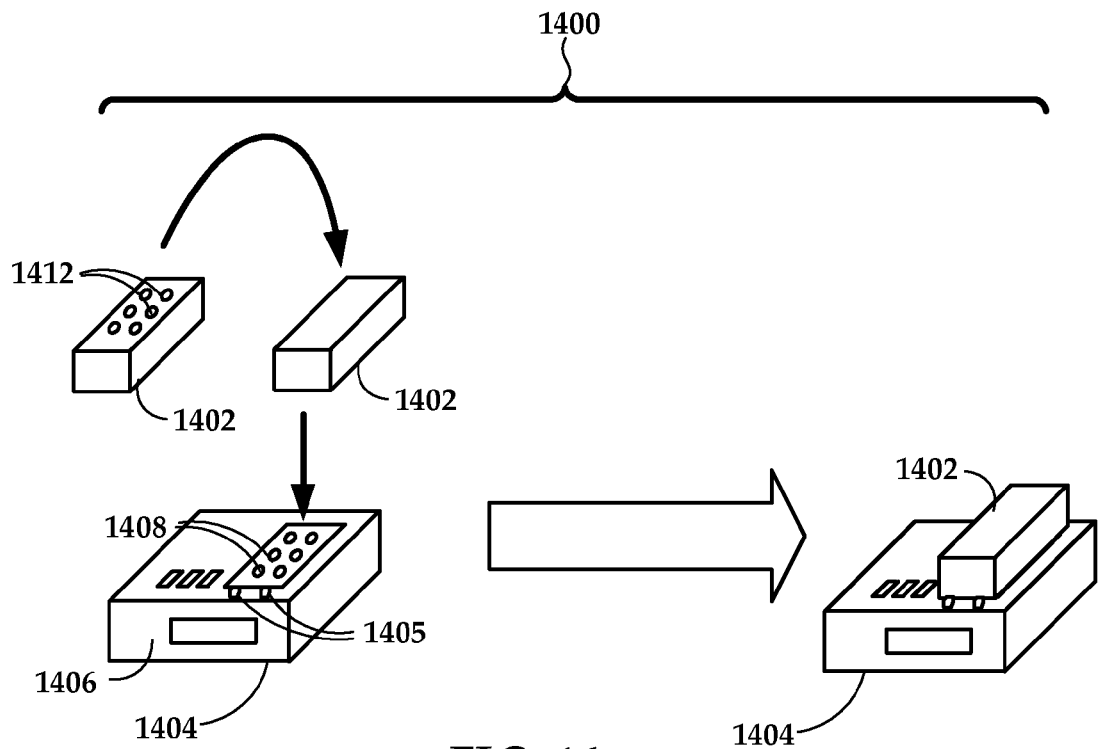
FIG. 14 is a perspective view illustrating assembly of laser submount and laser according to another example embodiment

In reference now to FIG. 14, a block diagram illustrates a process 1400 similar to that of FIG. 11, except that in this example, one or more mechanical alignment posts 1405 precisely define a location between mounting edge 1406 of the submount 1404 and laser bonding pads 1408. The alignment posts 1405 could be deposited and patterned (e.g. deposition or electroplating) or etched from the substrate itself. The laser bonding pads 1408 are designed to line up with pads 1412 on the underside of the laser 1402 to ensure proper alignment of the laser 1402 to the slider body.

Figure 15:
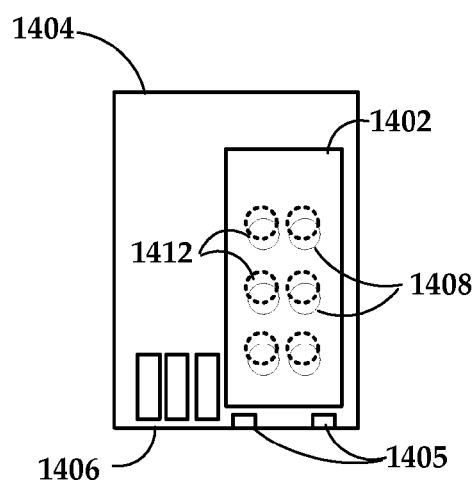
FIGS. 15 and 16 are top views illustrating alignment between laser submount and laser according to another example embodiment.
Figure 16:
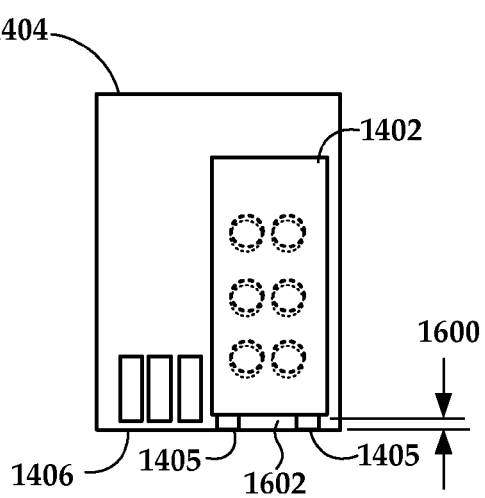

In this example, the laser 1402 and submount 1404 are placed through a rapid pick and place, then aligned through passive alignment during reflow. In this case, the alignment posts 1405 assist in the alignment. As seen in the top view of FIG. 15, the laser 1402 and submount 1404 are misaligned due to inaccuracies of the placement process. The laser 1402 and submount 1404 align against the alignment posts 1405 as seen in the top view of FIG. 16. This alignment against the alignment posts 1405 may occur before the reflow passive self-alignment allows the pads to fully align. This results in an alignment force of the laser against the alignment posts 1405. After alignment, an alignment dimension 1600 between the laser edge/facet 1602 and an edge 1406 of the submount is within a desired tolerance as defined by patterning of the alignment posts 1405.

Figure 17:
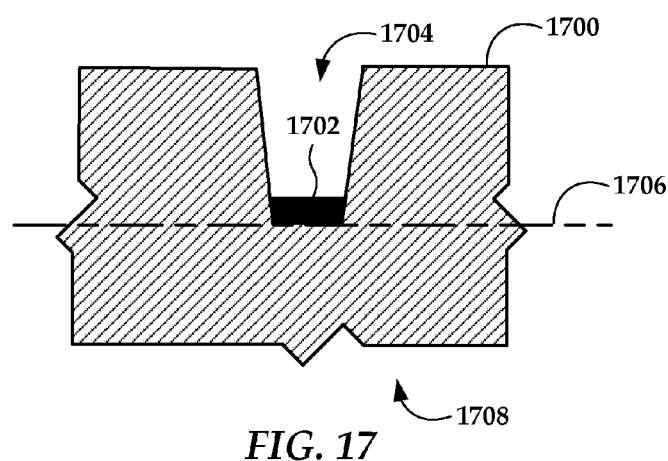
FIG. 17 is a cross-sectional view showing an etch stop layer in a trench according to an example embodiment.

Generally, the above-described processes facilitate precision forming of submounts through the creation of mechanical reference surfaces and mechanical reliefs during the patterning and etching process. The specific examples of DRIE silicon processing may be extended and combined with each other. For example, a photolithographically defined etch mask (such as photoresist) may be utilized with an anisotropic etch process to define a precisely aligned and shaped submount bar edge as a bar dicing process. This allows tight mechanical alignment to patterned features on the top surface of the substrate as well as a well-defined etched surface that can be used for bonding to the HAMR LOS slider The processes shown in FIGS. 9 and 10 may further use temporary or permanent layers deposited into the etched trenches to provide an etch stop layer in the trenches when etched or thinned from the backside. A cross-sectional view of a wafer portion 1700 in FIG. 17 illustrates a etch stop layer 1702 according to an example embodiment. The material of the etch stop layer 1702 is deposited in at least a bottom of a DRIE trench 1704 (and may cover the sides of the trench 1704 as well). When backgrinding or polishing from the back side 1708, the stop layer 1702 facilitates stopping the backgrind/polish along a predefined surface 1706. In other variations, sidewalls of the trench 1704 may be metallized after DRIE using sidewall passivation and metal deposition into the trench (either partially or fully filled). The metallized sidewalls protect them from lateral etching.

In the above examples, a single etch process was used to form edges of the submounts. In a variation on the above described processes, a multiple mask etch process can be used to form mechanical stoppers, reference steps, recession etches, etc., that extend up to or into the etch trench. An example embodiment of such a process 1800 is shown in the block diagram of FIG. 18. A wafer 1802 (or portion thereof) is formed at process step 1803, e.g., utilizing photolithography to form laser-on-slider submount features on a first surface. At process step 1805, a lower etch mask 1804 (e.g., $SiO_2$) is deposited over the first surface of the wafer 1802. This is followed by process step 1807 where an upper etch mask 1806 (e.g., photoresist) is deposited over the lower etch mask.

Generally, the lower mask 1804 and upper mask 1806 are configured so that a first etch 1809 is performed on the upper mask 1806 to a first desired etch depth. The upper mask is removed 1811 (e.g., chemical strip, oxygen plasma ash) to expose the lower mask 1804, and then a second etch 1813 is performed to a second depth. It can be seen that in this arrangement the lower etch mask 1804 has a smaller mask area, e.g., will cause a wider trench to be etched, then the upper mask 1806. The depth of the first etch 1809 will generally be deeper than the depth of the second etch 1813. Also, the materials for the masks 1804, 1806 are chosen so that the upper mask 1806 can be selectively removed at process step 1811.

Figure 18:
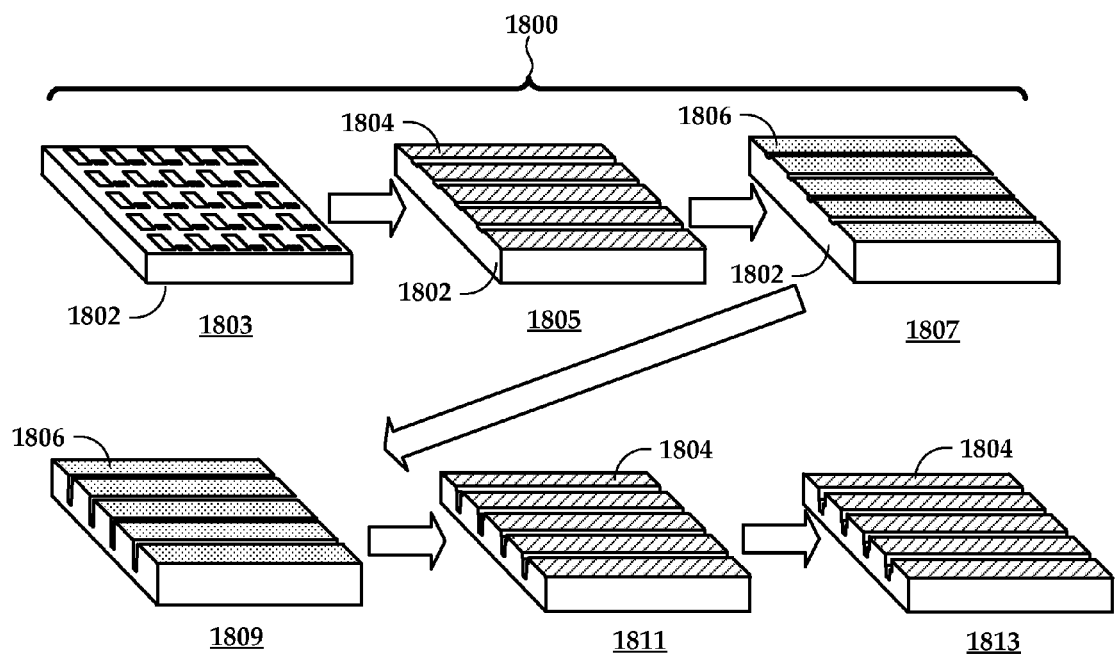
FIG. 18 is a block diagram illustrating a multiple-mask process used to create stepped scribe lines according to an example embodiment.
Figure 19:
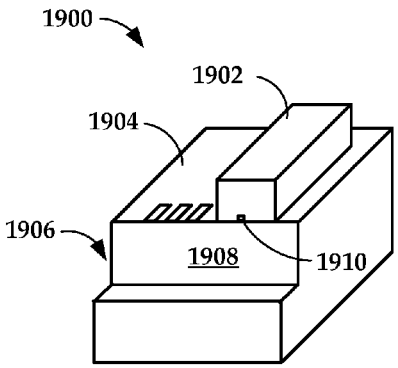
FIGS. 19 and 20 are perspective and side views of a laser and submount assembly according to an example embodiment that are formed using a process as shown in FIG. 18.
Figure 20:
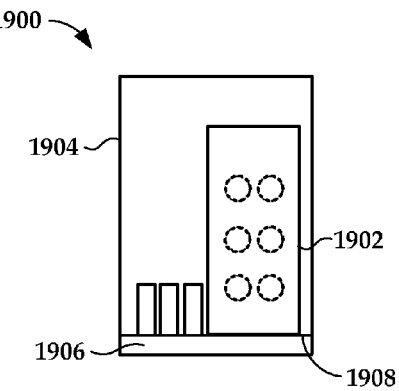

In FIGS. 19 and 20, perspective and top views shown a submount and laser assembly 1900 according to an example embodiment that may be formed using the process shown in FIG. 18. The assembly includes laser 1902 and submount 1904. The submount 1904 includes a recession or step 1906 formed using a multiple mask etch process. The recession or step 1906 can aid in assembly and/or act as a mechanical reference surface. For example, a surface 1908 of the step 1906 may be co-planar with an output facet 1910 of the laser 1902. The surface 1908 could be mechanically placed against both the laser facet output and the coupler on a slider body (e.g., waveguide coupler 500 shown in FIG. 5). The result is a well-defined and tightly controlled laser-to-coupler spacing.

While the above etching processes have been described as being DRIE, alternate etching processes may be used. For example, silicon substrate with a (1,1,1) plane orientation may be processed with a wet etch instead of DRIE for etched bar formation or die formation. Wet etching generally involves masking the substrate and applying a liquid solution that will etch through openings in the mask.

Figure 21:
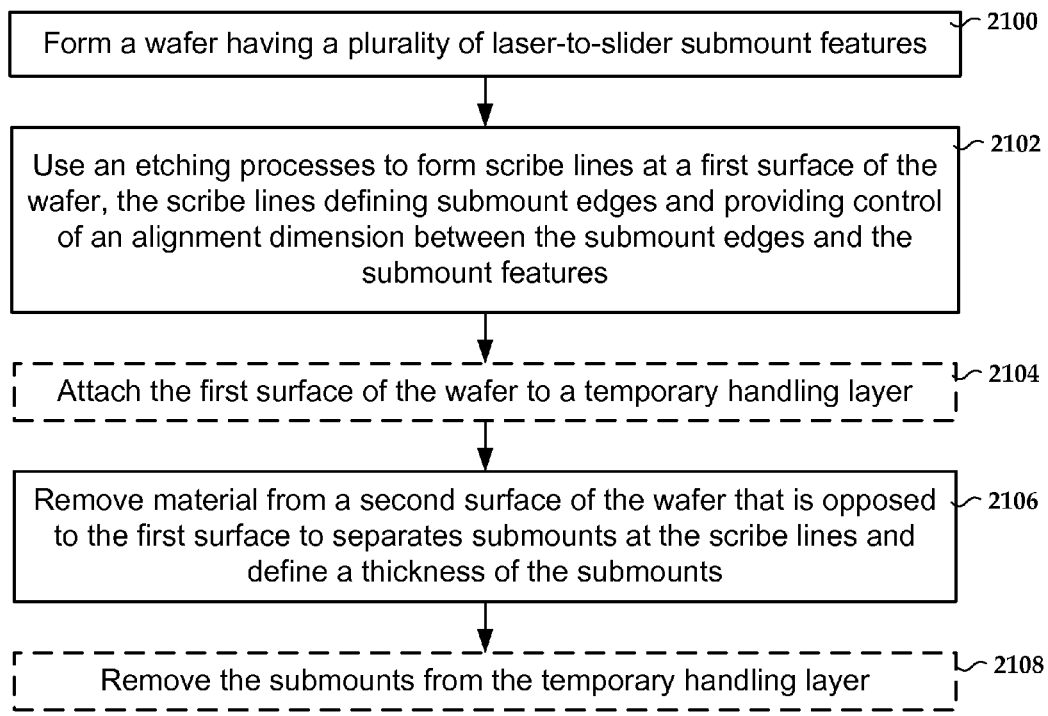
FIGS. 21-24 are flowcharts illustrating methods according to example embodiments.

In reference now to FIG. 21, a flowchart illustrates a method according to an example embodiment. The method involves forming 2100 a wafer comprising a plurality of laser-to-slider submount features, e.g., patterned features such as laser bonding pads. An etching process 2102 is to form scribe lines at a first surface of the wafer. The etching process 2102 may include an anisotropic etching process such as DRIE. The scribe lines define submount edges and provide control of an alignment dimension between the submount edges and the laser-to-slider submount features. The alignment dimension may include a distance between a laser emission surface and a submount-to-slider bonding surface The method may optionally involve attaching 2104 the first surface of the wafer to a temporary handling layer. The temporary handling layer may include at least one of a temporary handling substrate or film. Material is removed 2106 (e.g., backgrind or polish) from a second surface of the wafer that is opposed to the first surface. The removing 2106 of the material from the second surface separates submounts at the scribe lines and defines a thickness of the submounts. After the removing 2106 of the material, the submounts may be removed 2108 from the temporary handling layer if it was used.

Figure 22:
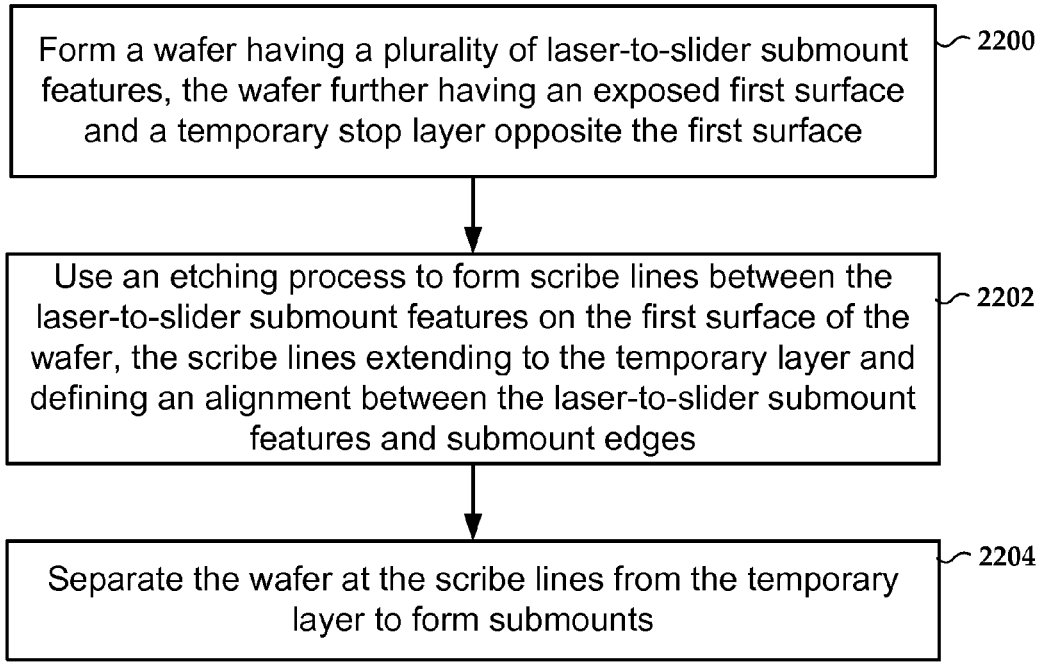

In FIG. 22, a flowchart illustrates a method according to another example embodiment. A wafer is formed 2200 having a plurality of laser-to-slider submount features (e.g., laser bonding pads). The wafer further has an exposed first surface and a temporary stop layer opposite the first surface. An etching process 2202 is used to form scribe lines between the laser-to-slider submount features on the first surface of the wafer. The scribe lines stop precisely at the temporary layer and define an alignment between the laser-to-slider submount features and submount edges. The alignment dimension may include a distance between a laser emission surface and a submount-to-slider bonding surface. The etching process 2202 may include an anisotropic etching process such as DRIE. The wafer is separated 2204 at the scribe lines from the temporary layer to form submounts. Separating 2204 the submount device layer from the temporary stop layer may involve applying one or more of heat, ultraviolet light, or a chemical releasing agent.

Figure 23:
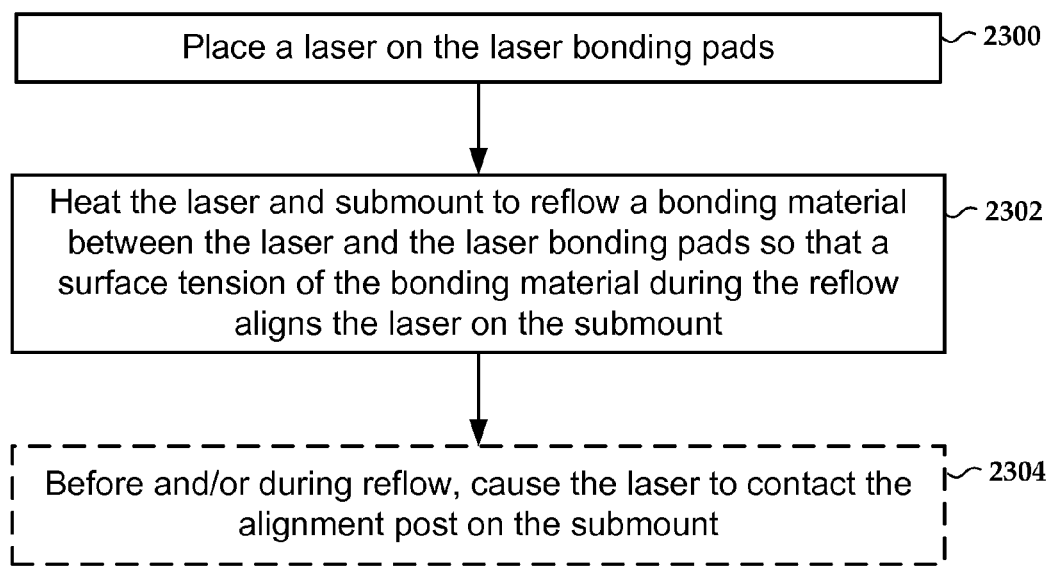
Figure 24:
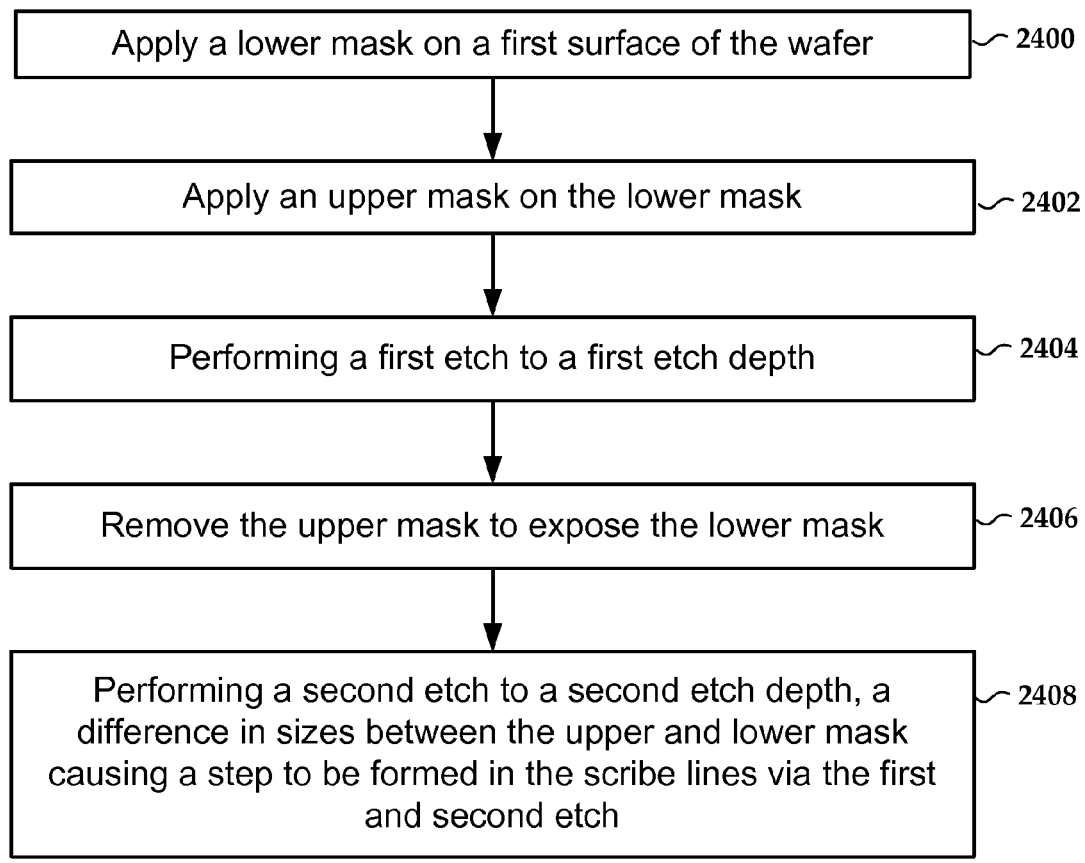

In FIG. 23, a flowchart illustrates additional procedures that may be performed using submounts formed as described in FIGS. 21, 22, and 24. A laser is placed 2300 on the laser bonding pads, and the laser and submount are heated 2302 to reflow a bonding material between the laser and the laser bonding pads. A surface tension of the bonding material during the reflow aligns the laser on the submount. Optionally, before and/or during reflow, the laser may be caused 2304 to contact an alignment post on the submount.

In FIG. 24, a flowchart illustrates additional procedures that may be additionally performed to produce submounts formed as described in FIGS. 21 and 22, the scribe lines defining the submount having a step. Forming the scribe lines involves applying 2400 a lower mask on the first surface of the wafer and applying 2402 an upper mask on the lower mask. A first etch is performed 2404 to a first etch depth, and the upper mask is removed 2406 to expose the lower mask. A second etch to a second etch depth is performed 2408. A difference in sizes between the upper and lower mask causes the step to be formed in the scribe lines via the first and second etch.

The foregoing description of the example embodiments has been presented for the purposes of illustration and description. It is not intended to be exhaustive or to limit the invention to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. A method comprising:
    forming a wafer comprising a plurality of laser-to-slider submount features, wherein the wafer comprises a first surface and a temporary layer opposite the first surface;
    using an etching process to form scribe lines between the laser-to-slider submount features on the first surface of the wafer after forming the laser-to-slider submount features, wherein the scribe lines extend to the temporary layer and define an alignment dimension between the laser-to-slider submount features and submount edges; and
    separating the wafer from the temporary layer, wherein the separating of the wafer from the temporary layer separates submounts at the scribe lines.

2. The method of claim 1, wherein the etching process comprises an anisotropic etching process.

3. The method of claim 1, wherein separating the wafer from the temporary layer comprises applying heat.

4. The method of claim 1, wherein the laser-to-slider submount features include laser bonding pads, and wherein the alignment dimension comprises a distance between a laser emission surface and a submount-to-slider bonding surface, the method further comprising for at least one of the submounts:
    placing a laser on the laser bonding pads; and
    heating the laser and submount to reflow a bonding material between the laser and the laser bonding pads, wherein a surface tension of the bonding material during the reflow aligns the laser on the submount.

5. The method of claim 1, wherein the scribe lines comprise stepped scribe lines that form mechanical reference surfaces on edges of the submounts.

6. The method of claim 5, wherein forming the stepped scribe lines comprises:
    applying a lower mask on the first surface of the wafer;
    applying an upper mask on the lower mask;
    performing a first etch to a first etch depth;
    removing the upper mask to expose the lower mask; and
    performing a second etch to a second etch depth, wherein a difference in sizes between the upper and lower mask causes the step to be formed via the first and second etch.

7. The method of claim 1, wherein separating the wafer from the temporary layer comprises applying ultraviolet light.

8. The method of claim 1, wherein separating the wafer from the temporary layer comprises applying a chemical releasing agent.

9. The method of claim 1, wherein the laser-to-slider submount features comprise alignment posts at the submount edges.

10. The method of claim 1, wherein no material is deposited in the scribe lines after forming the scribe lines and before separating the submounts at the scribe lines.

11. The method of claim 10, wherein separating the wafer from the temporary layer comprises applying one or more of heat, ultraviolet light, or a chemical releasing agent.

12. The method of claim 10, wherein the laser-to-slider submount features comprise alignment posts at the submount edges.

13. A method comprising:
    forming a wafer comprising a plurality of laser-to-slider submount features, wherein the wafer comprises a first surface and a temporary layer opposite the first surface;
    applying a lower mask on the first surface of the wafer;
    applying an upper mask on the lower mask;
    performing a first etch to a first etch depth;
    removing the upper mask to expose the lower mask;
    performing a second etch to a second etch depth, wherein a difference in sizes between the upper and lower mask causes a stepped scribe line to be formed via the first and second etch, the scribe lines extending to the temporary layer and defining an alignment dimension between the laser-to-slider submount features and submount edges; and
    separating the wafer from the temporary layer, wherein the separating of the wafer from the temporary layer separates submounts at the scribe lines.

14. The method of claim 13, wherein the laser-to-slider submount features include laser bonding pads, and wherein the alignment dimension comprises a distance between a laser emission surface and a submount-to-slider bonding surface.

15. The method of claim 14, further comprising for at least one of the submounts:
    placing a laser on the laser bonding pads; and
    heating the laser and submount to reflow a bonding material between the laser and the laser bonding pads, wherein a surface tension of the bonding material during the reflow aligns the laser on the submount.

* * * * *